United States Patent [19]

Takimoto

[11] Patent Number: 4,841,293

[45] Date of Patent: Jun. 20, 1989

[54] PROCESS FOR DISPLAYING INFORMATION

[75] Inventor: Masaaki Takimoto, Tokyo, Japan

[73] Assignee: Fuji Photo Film Co., Ltd., Kanagawa, Japan

[21] Appl. No.: 21,281

[22] Filed: Mar. 3, 1987

[30] Foreign Application Priority Data

Mar. 3, 1986 [JP]  Japan .................................. 61-45617

[51] Int. Cl.$^4$ .............................................. G09G 3/16
[52] U.S. Cl. ..................................... 340/763; 340/783;
350/353; 350/355; 365/119
[58] Field of Search ............... 340/752, 756, 763, 766,
340/783, 825.79, 825.81, 825.82; 357/40, 41, 42;
365/119; 346/135.1; 350/355, 357, 353

[56] References Cited

U.S. PATENT DOCUMENTS

| | | | |
|---|---|---|---|
| 3,973,136 | 8/1976 | Lee | 340/825.82 |
| 4,091,375 | 5/1978 | Robillard | 340/763 |
| 4,263,105 | 4/1981 | Robillard et al. | 346/135.1 |
| 4,737,781 | 4/1988 | Robillard | 340/783 |

Primary Examiner—Gerald L. Brigance
Assistant Examiner—Richard Hjerpe
Attorney, Agent, or Firm—Suchrue, Mion, Zinn, Macpeak & Seas

[57] ABSTRACT

A display panel comprising of a semiconducting oxide between layers of a hole injector and an electron injector. The electron injector contains a metal oxide in a fine particulate form. When the electron injector is biased negatively with respect to the hole injector, both holes and electrons are injected and an image is formed by the trapping of electrons in color centers in the oxide layer. Reverse biasing erases the image.

26 Claims, 2 Drawing Sheets

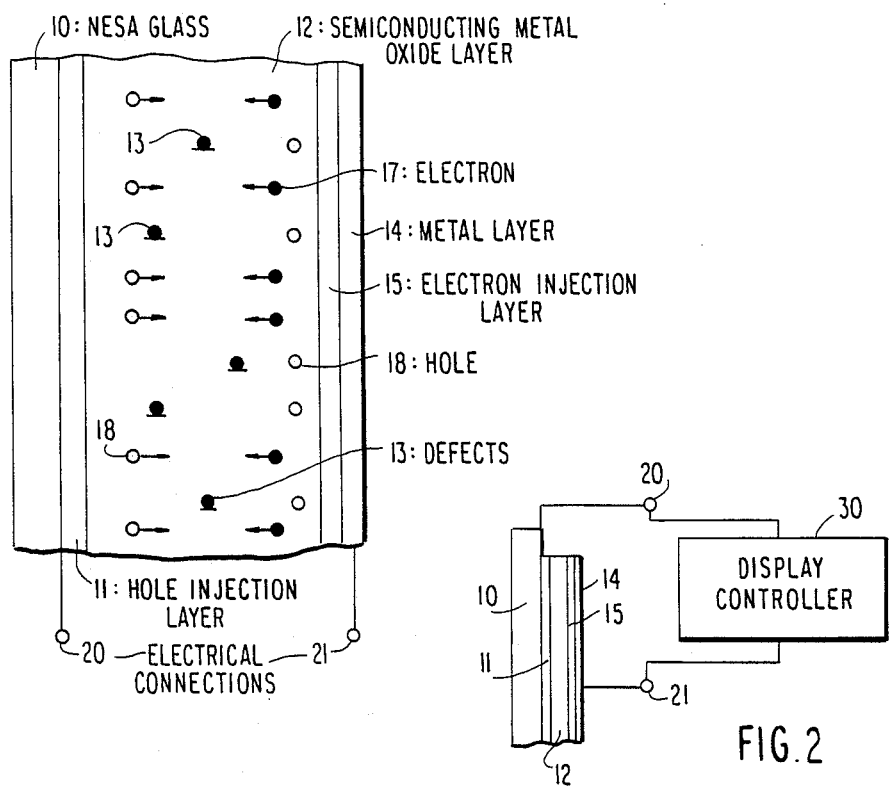
FIG. 1
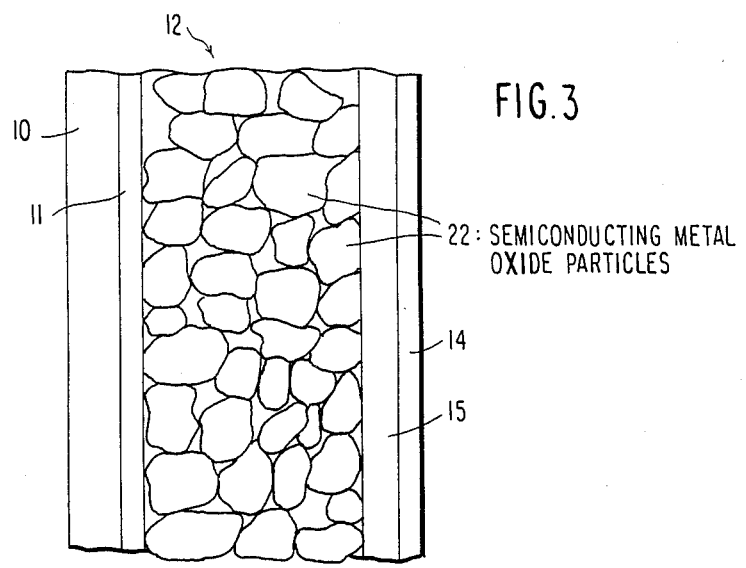
FIG. 2
FIG. 3

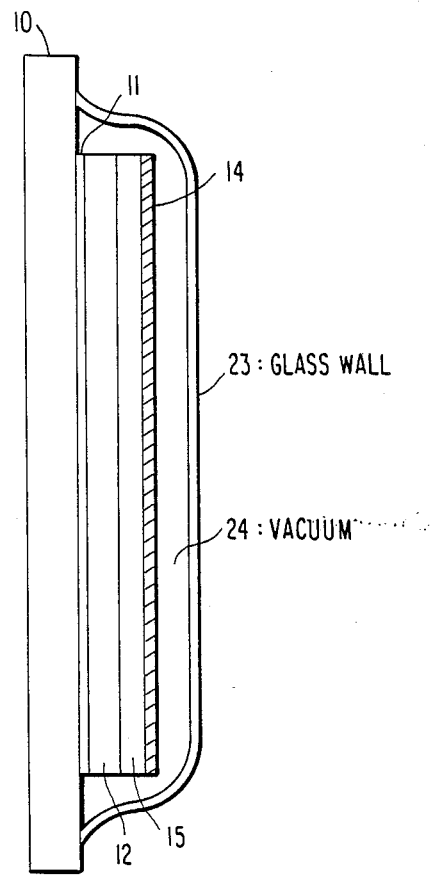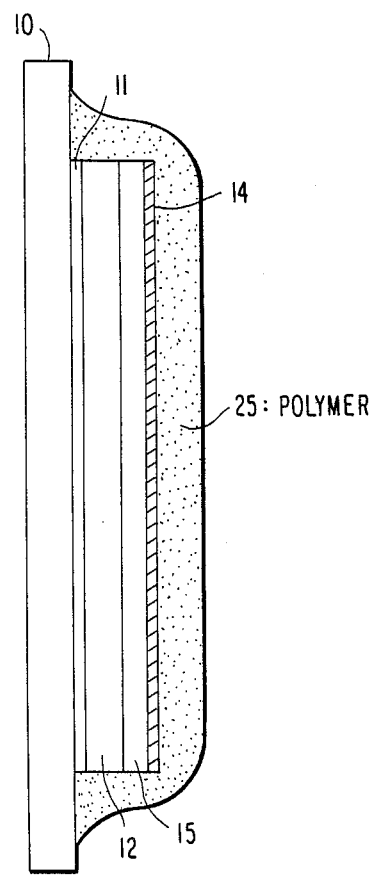

PROCESS FOR DISPLAYING INFORMATION

BACKGROUND OF THE INVENTION

1. Related Inventions

This application is related to U.S. patent application Ser. No. 833,699, filed Feb. 27, 1986, which corresponds to European Patent Application Publication No. 193,911.

2. Field of the Invention

The present invention relates to a process for displaying information, especially on a flat panel display.

3. Background of the Invention

The present display technology is evolving rapidly towards flat panel structures replacing the bulky and power consuming CRT in a number of applications where high resolution is not a primary concern.

This new generation of displays covers two main categories, namely the active and passive displays.

Active displays generate light on a flat surface, according to the visual pattern to be displayed. They are very much like the screen of a CRT and present the advantages and restrictions of a CRT. For example, the visibility depends on the light environment and a bright light falling on the screen hampers its readability.

Passive displays selectively reflect or absorb light to form the pattern building up the image. They are similar to a printed sheet of paper. The higher the ambient light is, the better the picture. They are most suitable for operation in high ambient light conditions.

The addressing of a flat display is generally based on digital control over a crossbar conductor system where picture elements are located at orthogonal X-Y intersections. TV-type scanning is possible using shift registers for addressing the X-Y intersections row-by-row in raster fashion.

A number of flat displays have been suggested in the past decade, and the various types are distributed between the passive (light modulating) types such as: Liquid Crystals Displays (LCD); Magneto Optics Displays (MOD); and Electrochromic Displays (ECD); and the active (light generating) types such as: Light emitting diodes arrays (LED); Plasma panels (GDD); and Electroluminescent displays (ELD). Liquid crystal displays (LCD) are by far the most successful flat display on the market today. They are relatively economical to build, provide a fair contrast image with a resolution which is now comparable to the cathode ray tube. They can also provide a color image with somewhat lower resolution than monochrome. However, they have the drawback of providing a variable contrast with the angle of viewing the image. The addressing time is still relatively slow and they need complicated circuitry for TV scanning.

Magneto optics displays (MOD) are still very expensive to produce due to the fact that they require single crystals which are necessarily expensive as large crystals or need an assembly or smaller crystals in a mosaic structure. Magneto optics displays are also difficult to address and require higher signal voltages than the liquid crystal display.

Electrochromic display (ECD) are the next best choice for a flat display after liquid crystals. They have the advantage over the liquid crystal display in providing an optical density based on the absorption of light rather than on scattering or on modulation of polarized light, which eliminates the variation of contrast with the direction of viewing. They are simpler in structure than the liquid crystal display and would probably lead to more economical manufacturing. The drawback at present is their slow response time and short life.

In the category of active displays, which present the inconvenience of restricted viewing in high light environments, the light emitting diodes array (LED) is an expensive display both from the point of view of manufacturing cost and power consumption. Also the resolution is limited by the smallest size of the individual diodes. Color display is possible but with much lower resolution than the passive liquid crystal display.

Plasma panels (GDD) have proven to be competitive with the LED arrays at a much lower price. The main drawbacks are high driving voltage and high production cost.

The electroluminescent display (ELD), especially the thin film ELD, is probably the only active display which can compete with the passive liquid crystal display. This type of display has a higher resolution and is economical to manufacture. However, color display still presents a problem, as does lifetime.

The specification of U.S. Pat. No. 4,091,375 discloses a novel flat display device that is dissimilar to any one of the prior art devices described above. This device is a flat panel which comprises, in order, a composite electron injecting means composed of a metal layer capable of electron injection, a thin dielectric layer and a very thin metal layer, a semiconducting metal oxide layer, and a conductive layer. When the metal electron injection layer is negatively biased with respect to the conductive layer, the electron injection layer in the composite electron injecting means is brought to a negative potential relative to the very thin metal layer, whereupon the electrons in the vicinity of the Fermi level in the electron injection layer are injected into the semiconducting metal oxide layer and trapped at the energy levels of the structural defects in that layer so as to produce color centers for effecting information display. This flat display device has many advantages such as quick response, high resolution and contrast, reduced variation in contrast at varying angles of viewing, a capacity of providing different colors at the same addressing point, and operability at low signal voltage and current. However, this flat display device is difficult to manufacture and its production cost is high because the electron injecting means it employs has a complex structure.

SUMMARY OF THE INVENTION

An object of the present invention is to provide a process for displaying information that is simple and which yet achieves a sufficiently high efficiency of electron injection to enable information to be displayed at high density.

This object of the present invention can be attained by a process of displaying information which comprises providing a layer of a semiconducting oxide disposed between an electron injection layer and a hole injection layer. A potential difference is selectively applied across the oxide layer with the electron injection layer being negatively biased relative to the hole injection layer to create an image by the dual injection of electrons and holes into the oxide layer. The image is formed by the trapping of electrons in color center promotion structural defects in the oxide layer. The image is erased by applying a potential difference of opposite polarity between the electron and hole injection layers. According to the invention, the electron injection layer contains a metal oxide in a fine particulate form.

In the present invention, a hole injection layer is disposed on the side opposite an electron injection layer, with a semiconducting oxide layer being present between the hole and electron injection layers. These dual injection layers allow a multitude of holes to be injected into the semiconductive oxide layer during the operation of the device. The injected holes are trapped within the semiconducting oxide layer and at the interface between this layer and the adjacent electron injection layer so that an applied electric field works effectively on the electron injection layer to promote the injection of electrons. As a consequence, the present invention provides a simple and inexpensive process for displaying information without employing a composite electron injection means having the complex structure shown in U.S. Pat. No. 4,091,375.

In addition, the fine particles of a metal oxide incorporated in the electron injection layer achieve the surprising effect of promoting the injection of electrons and increasing the contrast of displayed information.

BRIEF DESCRIPTION OF THE DRAWINGS

FIG. 1 is a schematic cross section of a display structure for the formation of color centers in a semiconducting metal oxide layer by dual injection of electrons and holes from opposite sides;

FIG. 2 is a schematic drawings of electrical connections to the display structure shown in FIG. 1;

FIG. 3 is a schematic cross section of a display structure using a layer of semiconductor particles for the formation of color centers;

FIG. 4 is a schematic drawings of a display structure mounted in an evacuated glass housing; and Fig 5 is a schematic drawing of a display structure in a protective coating of a water-impermeable polymer.

DETAILED DESCRIPTION OF THE PREFERRED EMBODIMENTS

In the present invention, image formation is based on the generation and erasing of color centers in a metal oxide semiconducting layer. The basic concept differs greatly from the three other types of passive displays, i.e. liquid crystals, magneto optics and electrochromics.

Color centers are generated in solids as result of the trapping of electrons in the vicinity of structural defects. The trapped electrons are weakly bonded to the defects and have a frequency of oscillation which corresponds to the visible or the UV part of the spectrum. In the former case they are called F centers and in the latter case V centers. The centers absorb light at a frequency corresponding to the frequency of oscillation of the trapped electron responsible for the center and generate the complementary color.

The condition for the creation of color centers in a solid is therefore the existence of structural defects and the promotion of electrons to be trapped in these defects. This promotion and trapping is possible if the defects correspond to certain energy levels in the band diagram of the material. The position of these levels determines the color of the centers and the energy necessary to promote the electrons to such levels Two cases are possible:

(a) The defects already exist in the material, in which case the color centers will be produced by promoting electrons to the corresponding energy level.

(b) The defects have to be created and electrons must be promoted to their energy levels. This case is the most common. It includes:

(A) Heating the material in the presence of the vapor of one of its constituents. This is typical for alkali halides where the material is heated in presence of the vapor of the alkali metal thus allowing diffusion of the metal atoms into the lattice structure of the halide and creating Frenkel type defects. The electrons are provided by thermal excitation of the cations of the lattice.

(B) Bombardment with high energy particles or radiation (X-rays, gamma rays, beta rays). The result is the displacement of an atom in the structure from its permanent position in the lattice into an interstitial position, leaving a vacancy. The electron trapped in that vacancy is generated by ionization following the irradiation.

(C) Schottky effect: A highly concentrated field due to a sharp electrode can produce a local flow of electrons with high energy which results in the creation of color centers in a similar way as for $\beta$-rays in (B) above.

Color centers displays have been known since the 1940's where they found application in radar projection displays: (Rosenthal, A. H. Proc. IRE. 5,203 (1940)). They consisted of a micro-crystalline layer of potassium chloride in place of the screen of a cathode ray tube. The color centers generated by an electron beam scanning the surface created an image which was projected to a larger size by suitable optical means. The erasing of the image was provided by heat and was therefore relatively slow. This is probably why this tube, called a skiatron, was never considered for television.

Early attempts to design a flat color centers display (Robillard J., C.R. NATO Conf. On Optoelectronic Signal Processing Techniques. Olso, Norway (1969)) were made using alkali halides, as basic data on these materials were readily available at the time. The electron injection was made with an electron beam in the same way as an ordinary cathode ray tubes. The erasing was still carried out by using the electrode conductive glass as a resistor.

The color center display process according to the present invention uses semiconducting metal oxides singly or as a mixture to provide a range of colors (N. P. Bogoroditskii, V. Kristya and Y. A. I. Panova, Fiz. Tverd. Tela 9,253 (1967)), and provides greatly superior results as regards both cost and performance compared to these prior attempts.

The present invention is hereinafter described in detail with reference to the embodiments shown in the accompanying drawings.

Referring now to FIG. 1, a flat panel structure is shown in schematic cross-section which operates according to an embodiment of the display process according to the present invention. The structure comprises a plate 10 of NESA glass, which is a known form of glass having a thin conductive layer (not shown) on one surface, in this case the inner or right-hand surface as seen in FIG. 1. A hole injection layer 11 of semiconducting material is formed on the conducting surface of the NESA glass 10, and next a semiconducting metal oxide layer 12 is provided which is heavily doped (or non-stoichiometric) to provide a high density of color center promoting structural defects 13. An electron injection layer 15 is formed on the side opposite the hole injection layer 11, with the oxide layer 12 being situated between the two layers 11 and 15.

In operation, the metal layer 14 is biased at a negative potential with respect to the conductive layer on the NESA glass 10. Under this condition, electrons near the Fermi level in the metal layer 14 are injected into the oxide layer 12 containing the color centers (see electrons indicated by 17) The injected electrons are trapped at the energy levels of the defects 13 in the oxide layer 12. As electrons 17 are injected into the oxide layer 12, an equal number of holes 18 have to be injected from the hole injection layer 11 in order to maintain an electronic equilibrium in the system. These holes 18 remain in the vicinity of the interface between the oxide and electron injection layers 12 and 15, creating space charges in this region.

The trapping of the electrons 17 in the defects 13 creates color centers as described. Naturally, in order to create a meaningful image, it must be possible to selectively bias the structure so that dual electron and hole injection occurs only in selected regions of the structure. To this end, in order to create an all points addressable display, the thin conductive layer on the NESA glass 10 is patterned in a series of parallel strips (X bars), typically several micrometers apart, and the metal layer 14 is likewise patterned in a series of parallel strips (Y bars) orthogonal to the strips on the glass 10. In this case, applying a potential difference between a given pair of X and Y bars (the X bar being positive relative to the Y bar) will produce a single picture element at the intersection of the two bars, and an entire image may be built up by energizing selected sets of X and Y bars as is well known in crossbar addressing.

In order to bring out the semiconductor properties in the hole injection layer 11 as well as the defects necessary to the production of color centers in the semiconducting oxide layer 12, it is necessary to "dope" these materials. The doping material and procedure will vary somewhat with the material concerned as will be understood by those skilled in the art, being determined by the energy band structure and other solid state properties. Two general methods can be used depending upon whether the hole injection or oxide layer 11 or 12 is: (a) an evaporated thin film of the semiconductor material, or (b) semiconductor particles dispersed in a binder and forming a coated layer.

In the former case (a) of evaporation, the doping can take place through the evaporation of an extremely thin film of the dopant on top of the semiconductor layer after formation of the latter and increasing the temperature of such layer to provide the diffusion of the dopant into the semiconductor layer. In the latter case (b) of dispersion, the semiconductor material is introduced in an aqueous solution of a salt of the dopant e.g. copper sulfide. It is agitated for several hours and then filtered and dried. The dry particles which have absorbed some of the dopant salts on their surface are then heated in a vacuum oven at a temperature allowing the diffusion of the dopant into the bulk of the particles for a several hours. The temperature will vary with the material to be doped and the dopant according to the diffusion characteristics of the dopant into the semiconductor. Table I lists a number of semiconductor materials together with appropriate dopants which may be used for the preparation of hole injection layers 11 and the temperature of diffusion. Table II shows a number of semiconducting metal oxide materials with the appropriate dopants and diffusion temperatures which may be used for the preparation of color centers forming layers 12.

TABLE I

| Semiconductor | Dopant | Diffusion Temperature °C. |
|---|---|---|
| ZnO | Ni | 350 |
| PbS | Cu | 700 |
| PbTe | Sn | 400 |
| PbSe | Sb | 400 |
| CdTe | Sb, Li | 400/120 |
| SnTe | Sb | 420 |
| $V_2O_5$ | V | — |
| $Al_2O_3$ | Y, Co | 850 |
| $Cr_2O_3$ | Ho, Mg | 800/550 |
| BeO | Ag | 750 |
| $In_2O_3$ | Gd, Sn | 800 |
| PbSnSe | Cu | 750 |
| PbSnTe | Cu | 750 |
| $Ta_2O_5$ | $O_2$ | 850 |
| $SnO_2$ | $O_2$ | 810 |
| ZnS | Sb, Li | 400/120 |
| CdS | Sb, Li | 400/120 |

TABLE II

| Semiconductor | Dopant | Diffusion Temperature °C. |
|---|---|---|
| $SnO_2$ | Ni, La | 850 |
| $TiO_2$ | Ti, La | 700 |
| ZnO | Li, Gd | 120/550 |
| $ZrO_2$ | Gd, Sn | 800 |
| $CeO_2$ | Cu | 700 |
| $LaO_2$ | La | 700 |

Information is displayed by the process of the present invention in the following manner.

When a DC potential difference is applied between a particular X bar and a Y bar, the Y bar being relatively negative, electrons and holes are injected at the point of intersection thereby creating color centers in this portion which appears as a color point on the display. If now a reverse potential difference is applied between the same bars with the necessary amplitude to create a field sufficient to extract the trapped electron from its weak bond, the color center is then destroyed and the point on the display is erased. The erasing potential difference will generally require a higher amplitude to generate the field necessary to extract the trapped electrons from their sites.

The density of any point of the image will be proportional to the density of defects in the material and the number of electrons injected to that particular point. A gray scale will then be possible by current modulation.

It is to be understood that where an alphanumeric character display is required, instead of forming X and Y bars, one of the conductive layers across which the biasing is applied can be in the form of character segments in a known fashion, for example as in liquid crystal calculator displays, with the other conductive layer applied continuously without striping or segmentation.

FIG. 2 corresponds to the structure of FIG. 1, and is illustrated to show electrical connections 20 and 21 to the NESA glass 10 and metal layer 14, respectively, which permit the aforementioned biasing to be applied (the connections are also shown in FIG. 2), although it is to be understood that such connections are only shown schematically since multiple connections to at least one side of the structure will of course be necessary for selective biasing. A display controller 30 can apply either a positive, a zero or a negative bias across the electrical connections 20 and 21 in order to create, continue or erase an image.

FIG. 3 is a structure similar to FIG. 1 using a dispersion of semiconducting metal oxide particles 22 in a binder as the color center forming layer 12. In other respects, the structure of FIG. 3 corresponds to that of FIG. 1.

FIG. 4 shows the display structure of FIGS. 1 and 2 mounted in an evacuated housing of a glass wall 23 of the evacuated housing having a free evacuated space 24 in that housing. FIG. 5 represents the display structure of FIGS. 1 and 2 encapsulated in a polymer 25 which is nonpermeable to air and water. In both cases the glass plate 10 forms the substrate on which the entire structure is supported, including the housing 23 or polymer 25. In both FIGS. 4 and 5 the other reference numerals correspond to those used in FIGS. 1 and 2.

The hole injection layer 11 can be obtained by vacuum evaporation onto the glass plate 10 of one of the following compounds: lead sulfide PbS, lead telluride PbTe, lead selenide PbSe, cadmium telluride CdTe, tin telluride SnTe, vanadium oxide $V_2O_5$, tantalum oxide $Ta_2O_5$, chromium oxide $Cr_2O_3$, beryllium oxide $Be_2O_3$, indium oxide $In_2O_3$, lead-tin selenide PbSnSe, lead-tin telluride PbSnTe or other material from Table I, to a thickness of from 0.2 1 micrometer. The evaporation is made in a vacuum chamber at $10^{-6}$ mm Hg using conventional techniques, and is followed by the deposition and diffusion of a suitable dopant as previously described.

The color center forming layer 12 can be obtained either by evaporation of the semiconducting metal oxide onto the hole injection layer 11 or by forming a layer made of a dispersion of the semiconducting metal oxide in an appropriate binder onto the hole injection layer. In both cases, the material used as semiconducting metal oxide can be chosen from among the following categories: tin oxide, titanium oxide, zinc oxide, zirconium oxide, or any of the rare earth materials such as cerium oxide and lanthanum oxide In the first case, the oxide can be evaporated in vacuum under a pressure of $10^{-6}$ mm Hg using a tantalum, molybdenum or tungsten boat up to a thickness of from 0.2 to 1 micrometers, followed by deposition and diffusion of a suitable dopant as indicated in Table II.

In the second case, the oxide, in the form of doped particles with a size of from 0.1 to 10 micrometers, is dispersed in a binder solution with an oxide to binder ratio varying from 3:1 to 5:1 in parts by weight and coated on the hole injection layer using standard coating methods. The final thickness of the coated layer after solvent evaporation is from 1 to 10 micrometers. The binder can be butadiene polymer, a styrene polymer or a butadiene-styrene copolymer. The hole injection layer 11 can also be made in this manner, the sole difference being that the doped particles used are selected from Table 1.

The metal layer 14 may be a thin metal film formed on the electron injection layer 15 by means of evaporation at a pressure of $10^{-6}$ mm Hg. This thin film may be formed of a metal of low work function such as antimony, bismuth, zirconium, silver, gold, copper, tungsten, molybdenum, nickel, aluminum, silicon or tantalum, which is deposited to a thickness of from 0.5 to 5 micrometers.

In the case of a crossbar structure, the metal will be evaporated through a mask forming parallel stripes oriented perpendicularly to the corresponding conductive stripes of the glass substrate 10. In the case of an alphanumeric display, the mask will form basic segments corresponding to the building elements of the character and the glass substrate 10 would carry a continuous unstriped conductive layer.

In the case of crossbar addressing, this metal layer 14 will be obtained by vacuum evaporation through a mask forming parallel stripes oriented perpendicularly to the corresponding stripes on the conductive glass substrate 10. In the case of alphanumeric display, the mask will form the segments building up the characters.

Much, although not all, of the forgoing has been described in U.S. patent application, Ser. No. 833,699.

The electron injection layer 15 is formed by coating the surface of the color center forming layer 12 with a dispersion of the particles of a metal oxide, ranging from 0.1 to 10 micrometers in size, in a binder solution, with the oxide to binder ratio being within the range of from 1:1 to 10:1 in parts by weight. In this case, any standard coating technique may be employed. The final thickness of the coating which has been freed of the solvent will range from 0.1 to 10 micrometers. A suitable binder may be selected from among a butadiene polymer, a styrene polymer, a butadiene-styrene copolymer, an acrylic acid ester polymer, an epoxy resin, alkyd resin, polyvinyl alcohol, gelatin, casein, etc. A suitable metal oxide may be selected from among titanium oxide, zinc oxide, tin oxide, etc., and particularly useful metal oxides are antimony doped tin oxide, nickel or aluminum doped zinc oxide, and a composite particulate oxide wherein a thin layer of antimony doped tin oxide is formed on the surface of the particles of titanium oxide. The layer including the metal oxide dispersed in a binder acts as a dielectric. The thin layer of tin oxide is effective if it has a thickness of at least 5 nanometers. Tin oxide may be doped with antimony, or zinc oxide with nickel or aluminum, in an amount ranging from 0.5 to 30 wt %, preferably ranging from 1 to 15 wt %

A display structure may be formed on a glass substrate by depositing the individual layers in the order that is reverse to that described above. That is, the metal layer 14 is first evaporated on a glass plate (which in this case is non-conductive), with the electron injection layer 15 being then formed, followed by the semiconducting metal oxide layer 12 and the hole injection layer 11.

The present invention is further described with reference to the following examples of a display structure that will be operated by the process of the present invention. In all of these examples, it is assumed that the semiconducting materials are doped as described earlier in this specification.

EXAMPLE I

On a conductive NESA glass plate, a layer of lead sulfide PbS having a thickness of 0.5 micrometers was evaporated in a vacuum at a pressure of $10^{-6}$ mm Hg. A second layer of tin oxide was then evaporated on top of the preceding layer, the new layer having a thickness of 1 micrometer. In a separate step, a composite oxide was prepared by forming a thin (10 nanometer) layer of 5 wt % antimony doped tin oxide on the surface of titanium oxide particles having an average size of 0.3 micrometer. The amount of the antimony doped tin oxide was about 20 wt % of the titanium oxide. Five parts by weight of this composite oxide was dispersed in a styrene-butadiene copolymer (Pliolite from Goodyear)

and the dispersion was applied, with toluene being used as a solvent, to the second layer of tin oxide to form a coating having a thickness of 1 micrometer. A fourth layer made of a vacuum evaporated film of gold having a thickness of 0.2 micrometer was formed through a suitable mask capable of providing segments of alphanumeric characters. When a voltage of 15 volts was applied between each gold segment and the conductive glass plate, with the gold segment negatively biased, a blue color formed in the region corresponding to the segments on which the voltage had been applied. The application of a reverse voltage of 20 volts caused the erasure of the visual information.

EXAMPLE II

On a conductive substrate made of NESA glass, a layer of lead selenide PbSe was evaporated under vacuum to provide a thickness of 0.5 micrometer.

An emulsion containing 5 parts by weight of cerium oxide dispersed in a solution of 1 part by weight of Vylit (a styrene-butadiene copoymer from Shell) in 24 parts by weight of toluene was prepared by ball milling the components for 24 hours. This emulsion was then coated on the previously deposited lead selenide layer to provide a thickness of 2 micrometers.

Another coating solution was prepared by dispersing 100 parts by weight of 10 wt % antimony doped tin oxide particles (average size: 0.3 micrometers) in 1,300 parts by weight of an aqueous solution of 3% polyvinyl alcohol. This coating solution was applied to the cerium oxide layer to provide a dry thickness of 0.5 micrometers.

A fourth layer made of evaporated zirconium was then formed on top of the tin oxide layer, this evaporated layer having a thickness of 0.5 micrometer. Evaporation of this last layer was carried out through a mask capable of forming segments of alphanumeric characters. When a voltage of 10 volts was applied between each segment and the conductive glass substrate, with the segment negatively biased, a red-brown color formed in the region corresponding to the segments on which the voltage had been applied. This colored area on the display was erased when a reverse voltage of 12 volts was applied.

EXAMPLE III

An emulsion having the following composition was prepared: 5 parts by weight of $Ta_2O$; 1 parts by weight of Pliolite (a styrene-butadiene resin from Goodyear); and 15 parts by weight of toluene. This composition was ball-milled for 24 hours and coated in a thickness of 0.8 micrometers on a conductive glass (NESA) plate. After drying the coated layer, a layer of $SnO_2$ was evaporated under vacuum to provide a thickness of 0.8 micrometer. A composite oxide coating solution of the same type as used in Example I was applied to the $SnO_2$ layer for a dry thickness of 1 micrometer. A fourth layer made of nickel was then evaporated on top of the composite oxide layer, this last layer having at thickness of 0.5 micrometer and its evaporation being conducted through a mask capable of providing segments of alphanumeric characters. When a voltage of 15 volts was applied between individual segments and the conductive glass plate, with the former being negatively biased, a green-blue color formed in the areas corresponding to the segments on which the voltage had been applied. The coloration disappeared when a reverse voltage of 20 volts was applied.

EXAMPLE IV

An aluminum layer of 0.5 micrometer thickness was evaporated on a glass plate through a mask capable of providing segments of alphanumeric characters. A dispersion of 100 parts by weight of 3 wt% nickel doped zinc oxide particles (average size: 0.3 micrometers) in 20 parts by weight of an acrylic acid ester copolymer (Dianal LR-018 from Mitsubishi Rayon) was coated, with toluene being used as a solvent, onto the aluminum layer to provide a thickness of 1 micrometer. A layer of doped tin oxide was then evaporated on the zinc oxide layer to provide a thickness of 1 micrometer. Subsequently, a layer of cadmium telluride was evaporated in a thickness of 0.2 micrometer, followed by evaporation of a uniform layer of a mixed indium and tin oxide providing an electrode.

When a voltage of 15 volts was applied between the aluminum electrode providing segments of alphanumeric characters and the indium-tin oxide electrode, with the aluminum electrode being negatively biased, a dark blue color formed in the areas corresponding to the energized segments. The information was erased when a reverse voltage of 20 volts was applied.

EXAMPLE V

Same as Example I except that the conductive layer of the NESA glass was patterned in the form of parallel strips 10 micrometers wide and 10 micrometers apart by a masking procedure and the metallic layer of the structure was patterned similarly but the strips were oriented perpendicularly to the direction of the strips on the glass.

EXAMPLE VI

Same as Example II except that the conductive layer of the NESA glass was patterned in the form of parallel strips as above and the metallic layer of the strucuture was patterned similarly but the strips were oriented perpendicularly to the direction of the strips on the glass.

EXAMPLE VII

Same as Example III except that the conductive layer of the NESA glass was patterned in the form of parallel strips as above and the metallic layer of the strucuture was patterned similarly but the strips were oriented perpendicularly to the direction of the strips on the glass.

It will be obvious that the present invention may be embodied with other changes, modifications and improvements which may occur to those skilled in the art, in the light of the foregoing teaching, without departing from the sprit and scope of the invention defined in the appended claims.

What is claimed is:

1. A process for displaying information, comprising the steps of:
   providing a layer of a semiconducting oxide disposed between an electron injection layer and a hole injection layer, said electron injection layer containing a metal oxide in a fine particulate form;
   selectively applying a potential difference across the oxide layer with the electron injection layer being negatively biased relative to the hole injection layer to create an image by the dual injection of electrons and holes into the oxide layer, the image being formed by the trapping of electrons in color center promoting structural defects in the oxide layer; and erasing the image by applying a potential difference of opposite polarity across the electron and hole injection layers.

2. A process according to claim 1, wherein said electron injection layer is a composite structure comprising an electron emitting metal layer and a dielectric layer that comprises said metal oxide and is in direct contact with said electron emitting metal layer and with said semiconducting oxide layer for the formation of color centers.

3. A process according to claim 1, wherein said electron injection layer contains an oxide in fine particulate form selected from the group of titanium oxide, zinc oxide and tin oxide.

4. A process according to claim 1, wherein said electron injection layer contains fine particles of antimony-doped tin oxide.

5. A process according to claim 1, wherein said electron injection layer contains fine particles of titanium oxide having a thin surface layer of antimony-doped tin oxide.

6. A process according to claim 1, wherein said metal oxide in said electron injection layer are fine particles of nickel-doped or aluminum-doped zinc oxide.

7. A process according to claim 1, wherein said providing step includes providing said hole injection layer by vacuum evaporating a film of a material selected from the group of lead sulfide, lead telluride, lead selenide, cadmium telluride, tin telluride, vanadium oxide, tantalum oxide, chromium oxide, beryllium oxide, indium oxide, lead-tin selenide and lead-tin telluride.

8. A process according to claim 1, wherein said providing step includes providing said hole injection layer comprising semiconductor particles in a binder, with the ratio of the particles to the binder ranging from 3:1 to 5:1 in parts by weight, said particles being made of a material selected from the group of zinc oxide, aluminum oxide, tantalum oxide, zinc sulfide and cadmium sulfide, and the binder being made of a material selected from the group of a butadiene polymer, a styrene polymer and a styrene-butadiene copolymer.

9. A process according to claim 1, wherein said providing step includes providing said semiconducting oxide layer by vacuum evaporating a film of material selected from the group of zinc oxide, tin oxide, titanium oxide, zirconium oxide, cerium oxide and lanthanum oxide.

10. A process according to claim 1, wherein said semiconducting oxide layer comprises oxide particles in a binder, with the ratio of the particles to the binder ranging from 3:1 to 5:1 in parts by weight, said oxide particles being made of zinc oxide, tin oxide, titanium oxide, zirconium oxide, cerium oxide or lanthanum oxide, and the binder being made of a butadiene polymer, a styrene polymer or a styrene-butadiene copolymer.

11. A process according to claim 1, wherein said hole injection layer comprises a doped semiconducting material.

12. A process according to claim 1, wherein said metal oxide is in the form of particles of 0.1 to 10 $\mu$m in size.

13. A process according to claim 1, wherein said providing steps includes providing said electron injection layer by the steps of dispersing particles of said metal oxide in a binder solution with a metal oxide to binder ratio being within the range of 1:1 to 10:1 in parts by weight to form a coating dispersion and coating a surface of said layer of said semiconducting oxide with said coating dispersion.

14. A process according to claim 1, wherein said providing step includes coating a surface of said semiconducting oxide with a dispersion of the fine particles of a metal oxide in a binder solution.

15. An information display, comprising:
a semiconductor oxide layer;
an electron injection layer formed on a first side of said semiconductor oxide layer and containing a metal oxide in a fine particulate form;
a hole injection layer formed on a second side of said semiconductor oxide layer; and
means for selectively applying a potential difference across said semiconductor oxide layer, when said electron injection layer being negatively biased relative to said hole injection layer an image being formed by dual injection of electrons and holes into said oxide layer, when said electron injection layer being positively biased relative to said hole injection layer said image being erased.

16. An information display as recited in claim 15, wherein said electron injection layer comprises an electron emitting metal layer and a dielectric layer that contains said metal oxide and is in direct contact with said electron emitting metal layer and with said semiconducting oxide layer.

17. An information display as recited in claim 15, wherein said electron injection layer contains an oxide in fine particulate form selected from the group of titanium oxide, zinc oxide and tin oxide.

18. An information display as recited in claim 15, wherein said electron injection layer contains fine particles of antimony-doped tin oxide.

19. An information display as recited in claim 15, wherein said electron injection layer contains fine particles of titanium oxide having a thin surface layer of antimony-doped tin oxide.

20. An information display as recited in claim 15, wherein said metal oxide in said electron injection layer comprises fine particles selected from the group of nickel-doped zinc oxide and aluminum-doped zinc oxide.

21. An information display as recited in claim 15, wherein said hole injection layer comprises a film of a material selected from the group of lead sulfide, lead telluride, lead selenide, cadmium telluride, tin telluride, vanadium oxide, tantalum oxide, chromium oxide, beryllium oxide, indium oxide, lead-tin selenide and lead-tin telluride.

22. An information display as recited in claim 15, wherein said hole injection layer comprises semiconductor particles in a binder, a ratio of said particles to said binder ranging from 3:1 to 5:1 in parts by weight, said particles being made of a material selected from the group of zinc oxide, aluminum oxide, tantalum oxide, zinc sulfide and cadmium sulfide, said binder being made of a material selected from the group of a butadiene polymer, a styrene polymer and styrene-butadiene copolymer.

23. An information display as recited in claim 15, wherein said semiconducting oxide layer comprises a film of a material selected from the group of zinc oxide, tin oxide, titanium oxide, zirconium oxide, cerium oxide and lanthanum oxide.

24. An information display as recited in claim 15, wherein said semiconducting oxide layer comprises oxide particle in a binder, a ratio of said particles to said binder ranging from 3:1 to 5:1 in parts by weight, said oxide particles being selected from the group of zinc oxide, tin oxide, titanium oxide, zirconium oxide, cerium oxide and lanthanum oxide and said binder being made of a material selected from the group of a butadiene polymer, a styrene polymer and a styrene-butadiene copolymer.

25. An information display as recited in claim 15, wherein said hole injection layer comprises a doped semiconducting material.

26. An information display according to claim 15, wherein said metal oxide is in the form of particles of 0.1 to 10 $\mu$m in size.

* * * * *